United States Patent
Miyazaki et al.

(10) Patent No.: US 7,750,665 B2
(45) Date of Patent: Jul. 6, 2010

(54) SEMICONDUCTOR DEVICE

(75) Inventors: You Miyazaki, Kanagawa (JP);
Mamoru Konno, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 0 days.

(21) Appl. No.: 12/076,327

(22) Filed: Mar. 17, 2008

(65) Prior Publication Data

US 2008/0231313 A1    Sep. 25, 2008

(30) Foreign Application Priority Data

Mar. 19, 2007   (JP) .............................. 2007-070134

(51) Int. Cl.
*H03K 19/00*   (2006.01)
(52) U.S. Cl. .............................. 326/16; 326/26; 326/82
(58) Field of Classification Search .................. 326/16; 324/158.1, 755, 763, 765
See application file for complete search history.

(56) References Cited

U.S. PATENT DOCUMENTS

| 7,049,839 B1 * | 5/2006 | Hsiao et al. .................. 324/755 |
| 7,519,888 B2 * | 4/2009 | Tabatabaei et al. .......... 714/733 |
| 2005/0047192 A1 | 3/2005 | Matsui et al. |

FOREIGN PATENT DOCUMENTS

JP    2005-78547    3/2005

* cited by examiner

*Primary Examiner*—Anh Q Tran
(74) *Attorney, Agent, or Firm*—McGinn IP Law Group, PLLC

(57) ABSTRACT

A semiconductor device according to the present invention includes an internal circuit executing a predetermined processing based on signal input from an external device, an output buffer driving line connected to an output terminal based on signal output from the internal circuit, a feedback line branched off from signal line in buffer transmitting data signal to an output stage circuit of the output buffer, and a delay test circuit connected to the feedback line.

19 Claims, 4 Drawing Sheets

SEMICONDUCTOR DEVICE

BACKGROUND OF THE INVENTION

1. Field of the Invention

The present invention relates to a semiconductor device, and more particularly, to a semiconductor device including a delay test circuit measuring signal delay generated in an internal circuit of the semiconductor device.

2. Description of Related Art

In recent years, there has been a problem in a semiconductor device that signal delay is occurred in the semiconductor device along with miniaturization of a manufacturing process and this signal delay causes malfunction. In order to measure this signal delay, a delay test circuit is often embedded in the semiconductor so as to measure the signal delay in the semiconductor device.

The signal delay is also occurred in an output of the semiconductor device. The signal delay in the output is occurred by resistance component or capacitance component that is parasitic in line connected to an external output terminal. Further, in the semiconductor device that is manufactured by using the miniaturized semiconductor process, an internal circuit is formed by element having low breakdown voltage and small size. It is therefore possible in the internal circuit to reduce chip size and power consumption due to low power supply voltage. On the other hand, the output is formed by element having higher breakdown voltage and larger size than the internal circuit. Then it is possible for the output to operate by power supply voltage that is higher than that of the internal circuit and to output signal having larger amplitude to the line connected to the external output terminal.

If the delay test circuit is formed adjacent to the output in such a semiconductor device so as to measure the signal delay that is occurred in the output, the circuit size in the output is increased, which means the chip size is increased. In order to overcome this problem, in the conventional example, the signal delay of the output is measured by outputting signals from the internal circuit to the output, connecting dummy capacitor predicting parasitic capacitance that is parasitic in the connected line with the external output terminal, and monitoring the signal that is delayed by the dummy capacitor. The example of such measurement system is disclosed in Japanese Unexamined Patent Application Publication No. 2005-78547 (patent document 1).

In this conventional example, the capacitor simulated as a line capacitor is connected to the external output terminal (terminal that is to be measured). Then signal output from the output buffer through the external output terminal and whose rising is delayed by the capacitor is input through the input buffer connected to the external output terminal. Then the signal delay at the output is measured by measuring timing where the signal is input to the output buffer and timing where the signal is input from the input buffer at the delay time measuring circuit. (See 0052-0059 and FIGS. 11 to 13 in patent document 1).

However, the signal delay occurred in the circuit of the output buffer is quite small compared with the signal delay occurred in the line capacitor. Therefore, if the signal delay is measured in the system including the line capacitor as in the conventional example, the delay amount due to the circuit of the output buffer may be confused with the whole delay amount. Therefore, in the conventional example, the delay occurred in the circuit of the output buffer cannot be measured with accuracy.

SUMMARY

According to one aspect of the present invention, there is provided a semiconductor device including an internal circuit executing a predetermined processing based on signal input from an external device, an output buffer driving line connected to an output terminal based on signal output from the internal circuit, a feedback line branched off from signal line in buffer transmitting data signal to an output stage circuit of the output buffer, and a delay test circuit connected to the feedback line.

According to the semiconductor device of the present invention, it is possible to monitor signals that are transmitted in the output buffer. In other words, according to the semiconductor device of the present invention, it is possible to measure the signal delay in the output buffer with accuracy without being influenced by the parasitic capacitance of the line connected to the external output terminal.

The semiconductor device according to the present invention achieves high reliability by improving observability in the output buffer.

BRIEF DESCRIPTION OF THE DRAWINGS

The above and other objects, advantages and features of the present invention will be more apparent from description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

Figure 1:
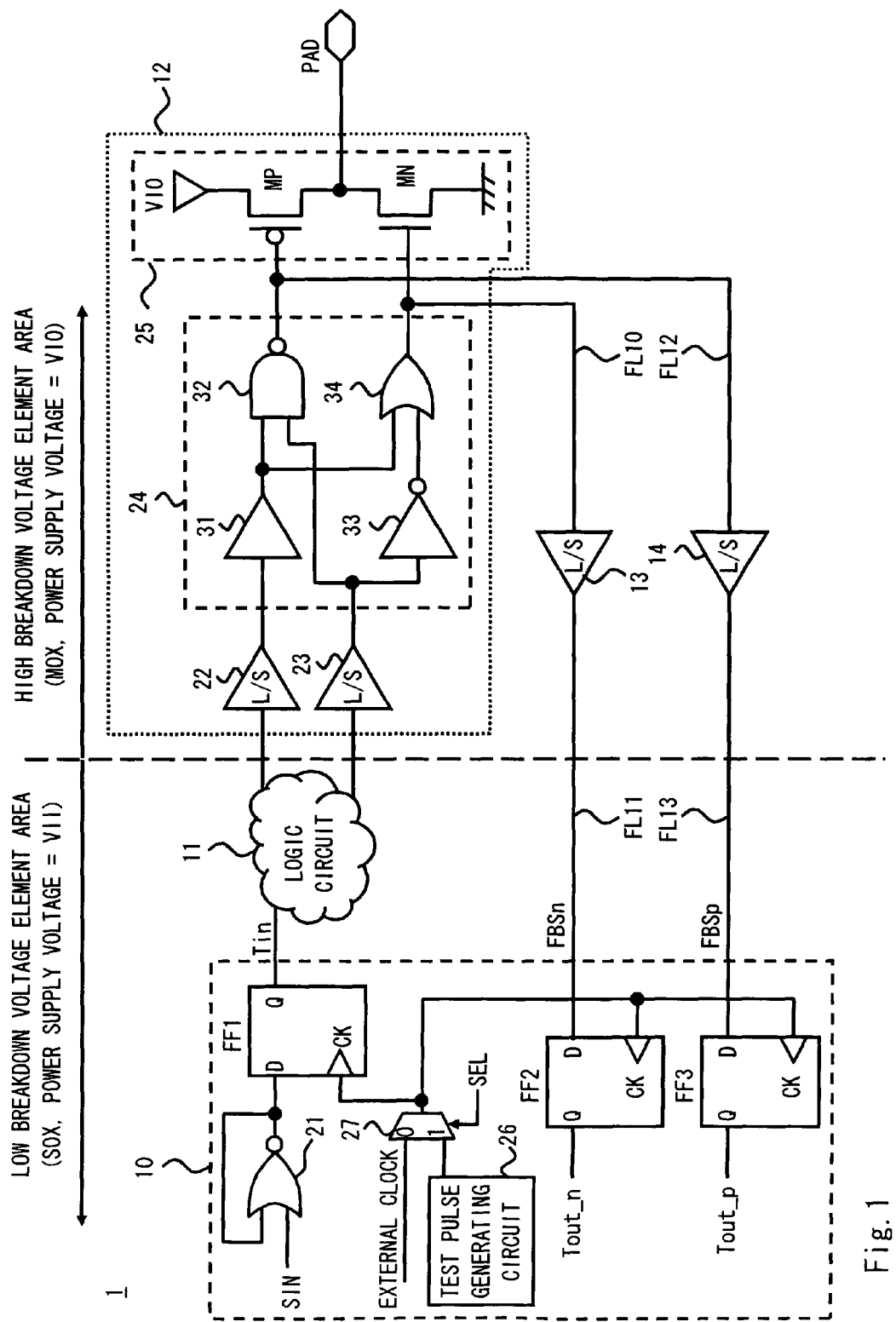
FIG. 1 is a circuit diagram of a semiconductor device according to a first embodiment of the present invention.

The embodiment of the present invention will be described hereinafter with reference to the drawings. FIG. 1 shows a circuit diagram of an output buffer 12 and other peripheral circuit in a semiconductor device 1 according to the first embodiment. Although FIG. 1 shows a delay test circuit 10, a logic circuit 11, and level shift circuits 13 and 14 as the peripheral circuit, the semiconductor device 1 may include other circuits that are not shown.

Power supply voltage in the delay test circuit 10 and the logic circuit 11 is internal power supply voltage VT, and power supply voltage in the output buffer 12 and the level shift circuits 13 and 14 is output power supply voltage VIO that is higher than the internal power supply voltage. The delay test circuit 10 and the logic circuit 11 are formed by low breakdown voltage element and formed in a low breakdown voltage element area of the area where the semiconductor device is formed. The output buffer 12 and the level shift circuits 13 and 14 are formed by high breakdown voltage element and formed in a high breakdown voltage element area of the area where the semiconductor device is formed. The low breakdown voltage element has single oxide structure (SOX) where gate oxide film is thin and transistor size is small, for example. The high breakdown voltage element has multi-oxide structure (MOX) where gate oxide film is thicker and transistor size is larger compared with the low breakdown voltage element, for example.

The delay test circuit 10 outputs test input signal Tin performing test of the output buffer 12 and receives test output signal (FBSn and FBSp in the drawing) output from the output buffer 12 based on the test input signal Tin. The delay test circuit 10 includes an NOR circuit 21, a first flip-flop (flip-flop FF1, for example), a second flip-flop (flop flops FF2 and FF3, for example), a test pulse generating circuit 26, and a selector 27.

The NOR circuit 21 has a first input terminal and a second input terminal. Test condition setting signal SIN is input to the first input terminal and the second input terminal is connected to an output terminal of the NOR circuit 21. The output terminal of the NOR circuit 21 is connected to an input terminal D of the flip-flop FF1. The flip-flop FF1 is a D flip-flop, for example. The flip-flop FF1 holds logic level input to the input terminal D according to rising edge of synchronization clock signal CLK input to a clock input terminal CK and outputs the value as the test input signal Tin from an output terminal Q. In the present embodiment, the synchronization clock signal CLK includes a launch clock and a capture clock. The launch clock designates timing in which the flip-flop FF1 outputs the test input signal. The capture clock designates timing in which the flip-flops FF2 and FF3 hold the test output signals output from the output buffer and transmitted through feedback lines.

The flip-flops FF2 and FF3 are D flip-flops, for example, and are provided according to feedback lines FL11 and FL13, respectively. In the present embodiment, the input terminal D of the flip-flop FF2 is connected to the feedback line FL11 and the input terminal D of the flip-flop FF3 is connected to the feedback line FL13. Both of the flip-flops FF2 and FF3 operate in synchronization with the synchronization clock signal CLK. Note that the input signal of the flip-flop FF2 is called test output signal FBSn and the output signal of the flip-flop FF2 is called test result signal Tout_n. The input signal of the flip-flop FF3 is called test output signal FBSp and the output signal of the flip-flop FF3 is called test result signal Tout_p.

The test pulse generating circuit 26 generates clock signals operating the flip-flops FF1 to FF3. In the present embodiment, the test pulse generating circuit 26 generates the launch clock and the capture clock. The launch clock designates the timing in which the flip-flop FF1 outputs the test input signal as the clock signal, whereas the capture clock designates the timing in which the flip-flops FF2 and FF3 hold the test output signals output from the output buffer and transmitted through the feedback lines as the clock signals. In other words, the test pulse generating circuit 26 only needs to output two kinds of pulses in a predetermined timing. The pulse generating circuit as disclosed in Japanese Unexamined Patent Application Publication No. 2006-38743 can be used as the test pulse generating circuit 26, for example.

The selector 27 selects the signal output from the test pulse generating circuit 26 or the external clock output from an external device according to the value of the selection signal SEL and outputs the selected signal. In other words, the clock signals supplied to the flip-flops FF1 to FF3 can be set according to the value of the selection signal SEL. Note that the flip-flops FF1 to FF3 need to be operated in synchronization with the same clock signal.

The logic circuit 11 is the combination circuit, for example. The logic circuit 11 decodes the test input signal Tin and outputs the decoded signal to the output buffer 12. The level shift circuits 13 and 14 convert amplitude levels of the signals at observation points that are transmitted through the feedback lines FL10 and FL12 to output the converted signals to the feedback lines FL11 and FL13. In the present embodiment, high level voltage of the test output signals FBSn and FBSp that are transmitted through the feedback lines is converted from the output power supply voltage VIO to the internal power supply voltage VII.

The output buffer 12 drives external line connected to the external terminal (pad, for example) based on the signal generated by the internal circuit (not shown) performing a predetermined process according to the signal input from external device. The output buffer 12 includes level shift circuits 22 and 23, a driving circuit 24, and an output stage circuit 25. These circuits are connected by signal line in buffer in the output buffer 12. The level shift circuits 22 and 23 convert high level voltage of the signals input from the logic circuit 11 from the output power supply voltage VIO to the internal power supply voltage VII. The level shift circuits 22 and 23 transmit the signals input from the logic circuit 11 to the driving circuit 24.

The driving circuit 24 includes a non-inverting buffer 31, an NAND circuit 32, an inverting buffer 33, and an OR circuit 34. The non-inverting buffer 31 directly outputs logic value of the input signal. The NAND circuit 32 performs AND operation on the signals input to the first input terminal and the second input terminal to output inverting logic of the operation result. The inverting buffer 33 inverts the logic value of the input signal to output the inverted value. The OR circuit performs OR operation on the signals input to the first input terminal and the second input terminal to output the operation result.

The output from the level shift circuit 22 is input to the non-inverting buffer 31. The output of the non-inverting buffer 31 is connected to the first input terminal of the NAND circuit 32 and the first input terminal of the OR circuit. The second input terminal of the NAND circuit 32 is connected to the output of the level shift circuit 23. The output of the level shift circuit 23 is input to the inverting buffer 33. The output of the inverting buffer 33 is connected to the second input terminal of the OR circuit 34.

The output stage circuit 25 is the circuit including a PMOS transistor MP and an NMOS transistor MN connected in series between power supply terminal and ground terminal. A contact point between a drain of the PMOS transistor MP and a drain of the NMOS transistor MN is the output terminal of the output buffer 12 and is connected to a pad. A gate of the PMOS transistor MP is connected to the output of the NAND circuit 32 and a gate of the NMOS transistor MN is connected to the output of the OR circuit 34.

The feedback line FL10 is branched off from the signal line in buffer connecting the NAND circuit 32 and the PMOS transistor MP. The feedback line FL12 is branched off from the signal line in buffer connecting the OR circuit 34 and the NMOS transistor MN. In the present embodiment, the feedback line in the input side of the level shift circuit 13 is called FL10 and the feedback line in the output side of the level shift circuit 13 is called FL11. However, these feedback lines are identical with each other except for the signal level in transmission. Further, the feedback line in the input side of the level shift circuit 14 is called FL12 and the feedback line in the output side of the level shift circuit 14 is called FL13. However, these feedback lines are also identical with each other except for the signal level in transmission.

Figure 2:
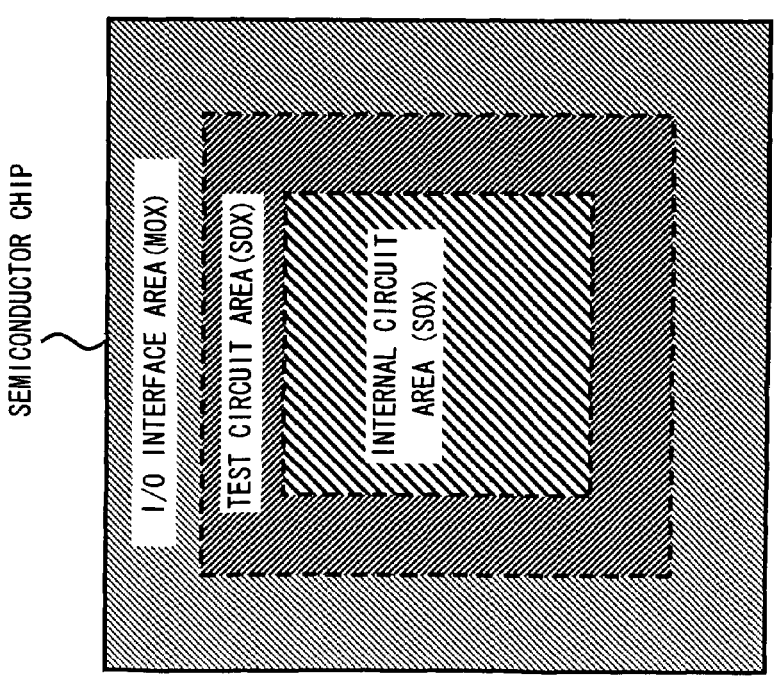
FIG. 2 is a schematic diagram of a semiconductor chip according to the first embodiment of the present invention.

Now, the arrangement of the output buffer 12 and the peripheral circuit in the semiconductor chip will be described. FIG. 2 shows a schematic view of an area in which each circuit is provided on the semiconductor chip. As shown in FIG. 2, an I/O interface area is formed along with periphery of the semiconductor chip. The output buffer 12 and the level shift circuits 13 and 14 are formed in the I/O interface area. The high breakdown voltage element (shown in MOX in FIG. 2) is formed in the I/O interface area.

There is provided an area where the low breakdown voltage element (shown in SOX in FIG. 2) is formed inside the I/O interface area. The low breakdown voltage element area is separated into a test circuit area and the internal circuit area. The test circuit area is where the delay test circuit 10 is formed. The test circuit area is in the periphery of the low breakdown voltage element area and is formed in the area adjacent to the I/O interface area. The internal circuit area is where the logic circuit 11 and other internal circuits that are not shown are formed. The internal circuit area is formed inside the test circuit area.

Figure 3:
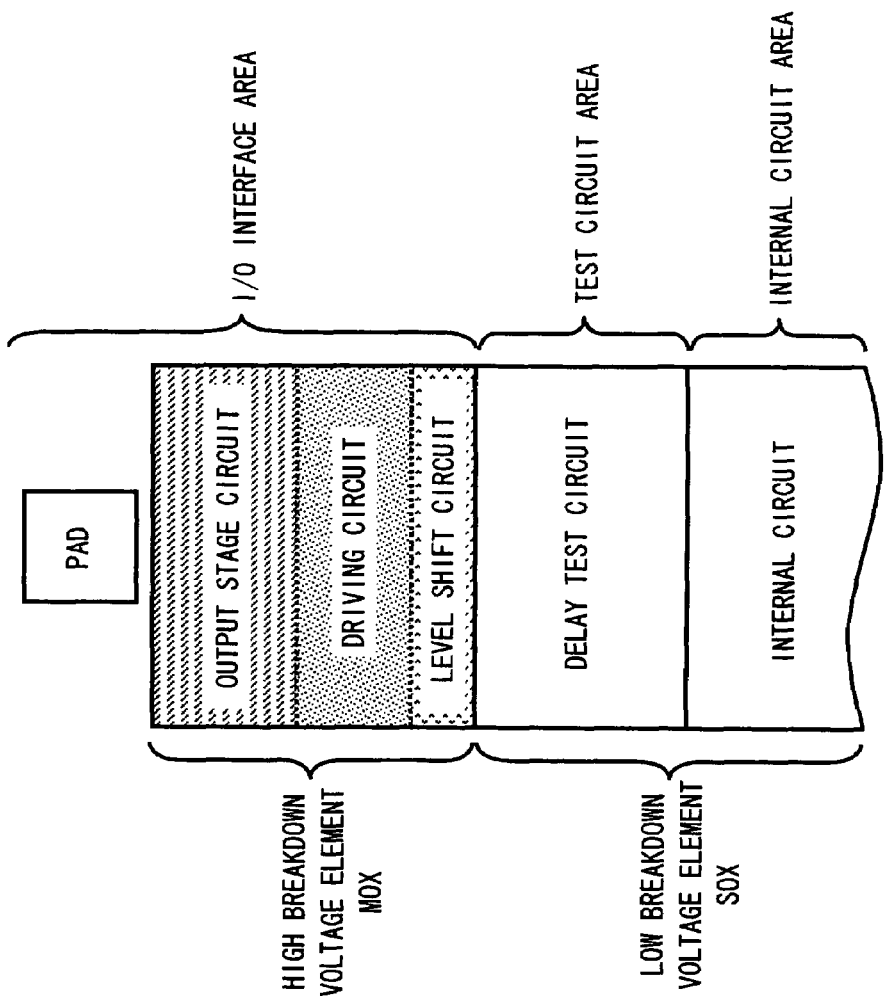
FIG. 3 is a schematic diagram showing an arrangement of the semiconductor device on the semiconductor chip according to the first embodiment of the present invention.

FIG. 3 shows a detailed arrangement example of each circuit shown in FIG. 1. In FIG. 3, the upper side of the drawing (the side where the pad is provided) is the peripheral direction of the semiconductor chip. As shown in FIG. 3, the I/O interface area is provided in the peripheral side of the semiconductor chip. The test circuit area and the internal circuit area are formed in the inner part thereof. The pad, the output stage circuit, the driving circuit, and the level shift circuits are formed in the I/O interface area. The pad is provided in the outermost part of the semiconductor chip. The output stage circuit, the driving circuit, and the level shift circuits are provided in the high breakdown voltage element area. The output stage circuit, the driving circuit, and the level shift circuits are provided in this order from the outermost part of the semiconductor chip. The delay test circuit and the internal circuit are provided in the low breakdown voltage element area.

Figure 4:
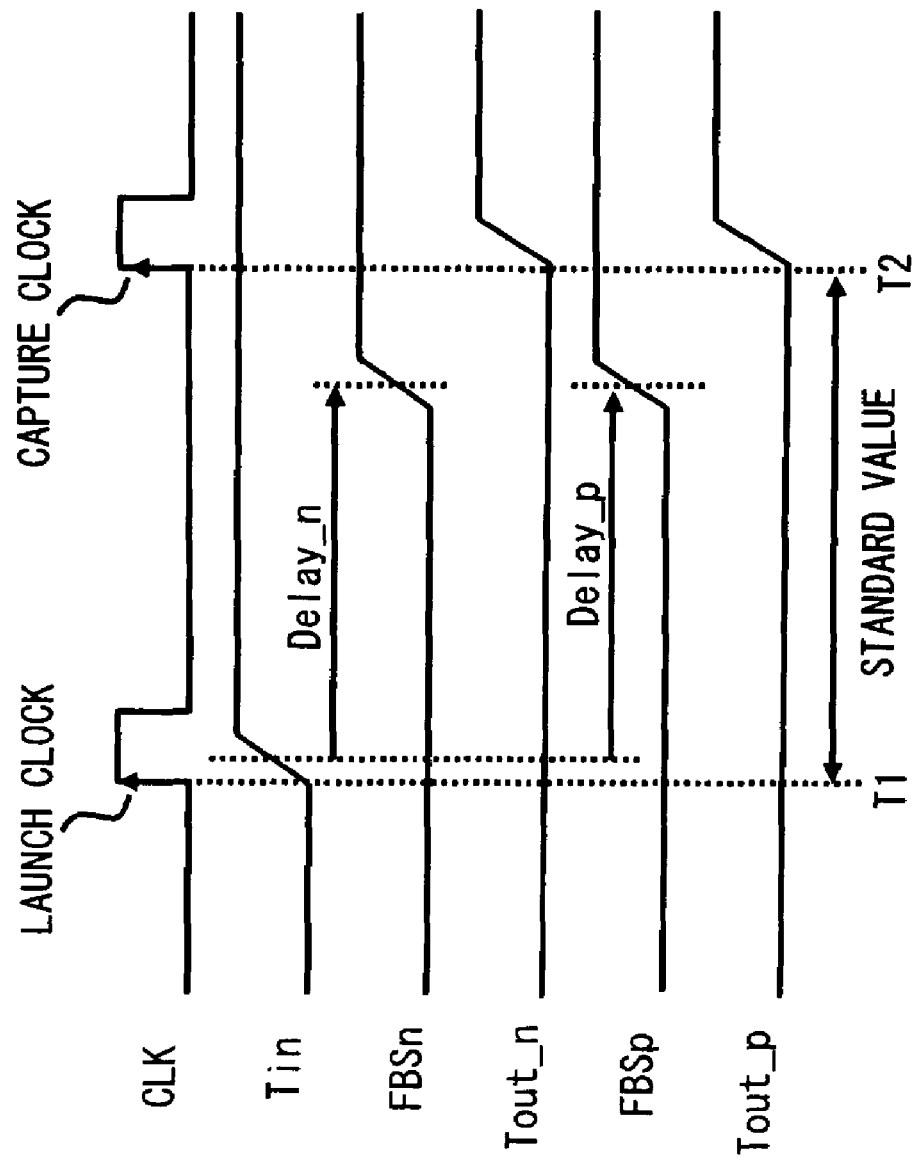
FIG. 4 is a timing chart showing a test result signal output from a delay test circuit 10 and a test output signal obtained from an output buffer 12 in delay test in the semiconductor device according to the first embodiment of the present invention.

Now, a procedure of the delay test in the semiconductor device will be described. FIG. 4 shows a timing chart of a test result signal output from the delay test circuit 10 and a test output signal output from the output buffer 12 in delay test. In FIG. 4, only the operation in the delay test of the output buffer is shown, and the setting of the test signal (shift in period) and the following output of the test result (shift out period) are omitted.

As shown in FIG. 4, the delay test is performed by providing the launch clock and the capture clock for the delay test circuit 10. The launch clock provides the test input signal Tin for the output buffer 12, and the capture clock captures the test output signals FBSn and FBSp output from the output buffer by the delay test circuit 10. When the rising of the launch clock is given to the delay test circuit 10 at timing T1, the value of the test input signal Tin is input to the flip-flop FF1. Thus the test input signal Tin rises.

Next the output buffer 12 starts to operate according to the change of the test input signal Tin. Then the logic level of the signal line in buffer of the output buffer 12 varies with some delay. The change of this signal is transmitted through the feedback line branched off from the signal line in buffer. In the present embodiment, the value of the test output signal FBSp is transmitted through the feedback line branched off from the signal line in buffer connected to the gate of the PMOS transistor MP, and the value of the test output signal FBSn is transmitted through the feedback line branched off from the signal line in buffer connected to the gate of the NMOS transistor MN. Note that the test output signal FBSp and the test output signal FBSn are changed from the change of the test input signal Tin with delay times Delay_p and Delay_n, respectively.

Then the capture clock rises at timing T2, and the test output signals FBSn and FBSP are input to the flip-flops FF2 and FF3. After this operation, the test result can be determined by reading out the values input to the flip-flops FF2 and FF3. The time difference of the rising of the launch clock and the capture clock is made a standard value specifying tolerance range of the delay time. If the test result that is read out is different from the desired value, the signal is not transmitted within the standard value, which means that it is possible to determine that the delay fault is occurred. Note that the delay time that can be measured in the present embodiment is the time that can be obtained through the logic circuit 11, the level shift circuits 22 and 23, the driving circuit 24, and the level shift circuits 13 and 14.

In the conventional example, the signal delay in the output buffer cannot be observed when the internal circuit and the output buffer are formed by different kinds of elements. Further, in the conventional example, the influence of the signal delay due to the line capacitor connected to the external terminal is so great that the signal delay of the output buffer cannot be measured with high accuracy when the delay time of the output buffer is measured. On the other hand, according to the semiconductor device 1 of the present embodiment, there is provided a feedback line branched off from the signal line in buffer. Therefore, it is possible to measure the signal delay that is occurred in the output buffer with high accuracy without being influenced by the control capacitor of the line connected to the external output terminal. The branch point of the feedback line can be arbitrarily set on the signal line in buffer. Therefore, it is possible to finely measure the signal delay of the output buffer.

As stated, according to the semiconductor device of the embodiment, it is possible to achieve higher reliability than the conventional example by measuring detailed delay time of the output buffer that is not possible in the conventional example. According to the semiconductor device of the present embodiment, it is possible to achieve high reliability because the semiconductor device has high observability in the output buffer.

In the present embodiment, the delay test circuit is provided in the low breakdown voltage element area so that the delay test circuit is formed by the transistor having small size. Therefore, the chip size is not increased by the delay test circuit.

Other Variant

Figure 5:
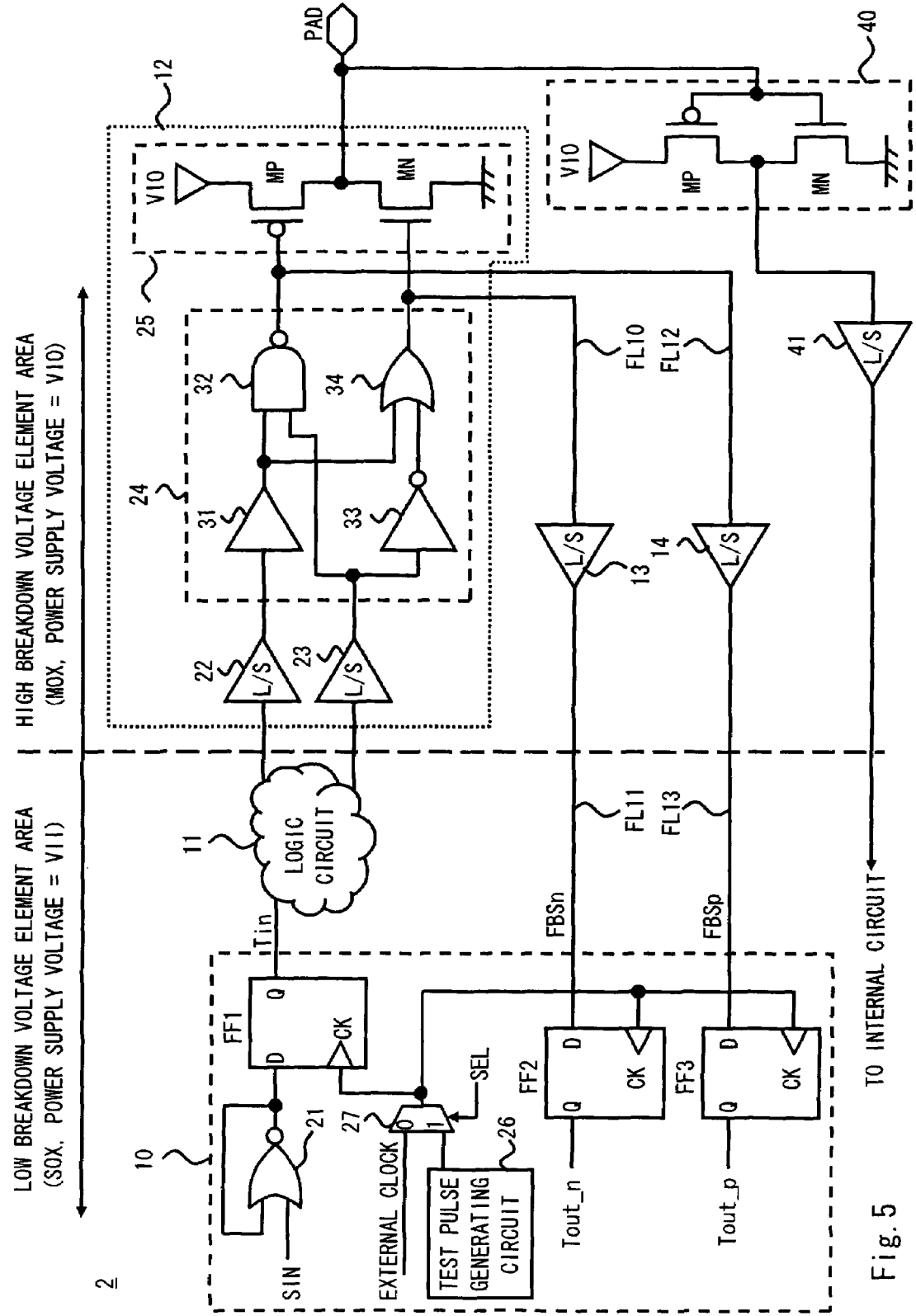
FIG. 5 is a circuit diagram of the semiconductor device according to other variant example of the first embodiment of the present invention.

The semiconductor device 2 according to the other variant example is shown in FIG. 5. As shown in FIG. 5, the semiconductor device 2 includes an input buffer 40 and a level shift circuit 41 added to the input buffer 40, both of which are not shown in the semiconductor device 1. In other words, the output buffer of the semiconductor device 1 is made two-way buffer in the semiconductor device 2. Even in this case, it is possible to branch the feedback line from the signal line in buffer in the output buffer 12 to enhance the observability of the output buffer 12.

It is apparent that the present invention is not limited to the above embodiments, but may be modified and changed without departing from the scope and spirit of the invention. For example, the configuration of the driving circuit 24 is not limited to that shown in the embodiment but can be properly changed according to the output stage circuit.

What is claimed is:

1. A semiconductor device comprising:
an internal circuit executing a predetermined processing based on a signal input from an external device;
an output buffer outputting an output signal to an output terminal based on a signal output from the internal circuit;
a feedback line branched off from a signal line in the output buffer transmitting a data signal to an output stage circuit in the output buffer; and
a delay test circuit connected to the feedback line,
wherein the delay test circuit outputs a test input signal to the output buffer and receives a test output signal from the output buffer through the feedback line, and
wherein the feedback line provides the data signal to the delay test circuit to test a delay.

2. The semiconductor device according to claim 1, wherein the delay test circuit includes a first flip-flop outputting the test input signal to the output buffer and a second flip-flop receiving the test output signal output from the output buffer through the feedback line, and
wherein the first and second flip-flops operate in synchronization with a same clock signal.

3. The semiconductor device according to claim 2, wherein the clock signal includes a launch clock specifying an output timing of the test input signal and a capture clock specifying a storing timing of the test output signal.

4. The semiconductor device according to claim 3, further comprising a test pulse generating circuit outputting the launch clock and the capture clock at a predetermined timing.

5. The semiconductor device according to claim 4, further comprising a selector selecting between a clack signal output from the test pulse generating circuit and a clock signal output from an external device according to a selection signal, and supplying the selected clock signal to the first and second flip-flops.

6. The semiconductor device according to claim 1, wherein the output buffer is formed by high breakdown voltage elements, and the internal circuit and the delay test circuit are formed by low breakdown voltage elements having lower breakdown voltage than that of the high breakdown voltage elements.

7. The semiconductor device according to claim 6, wherein the output buffer is formed in a high breakdown voltage element area where the high breakdown voltage elements are formed, and the internal circuit is formed in a low breakdown voltage element area where the low breakdown voltage elements are formed.

8. The semiconductor device according to claim 1, wherein the feedback line is branched off from the signal line in the output buffer connected to the output stage circuit in the output buffer.

9. The semiconductor device according to claim 1, wherein the delay test circuit comprises:
a first data holding part outputting the test input signal to the output buffer; and
a second data holding pan receiving, through the feedback line, the test output signal output from the signal line transmitting the data signal to the output stage circuit of the output buffer.

10. The semiconductor device according to claim 9, wherein the first and second data holding parts temporarily hold a signal for a predetermined period of time and operate in synchronization with a same clock signal.

11. The semiconductor device according to claim 10, further comprising a test pulse generating circuit outputting the clock signal including a launch clock and a capture clock at a predetermined timing, the launch clock specifying an output timing of the test input signal and the capture clock specifying a storing timing of the test output signal.

12. The semiconductor device according to claim 11, further comprising a selector selecting between a clock signal output from the test pulse generating circuit and a clock signal output from an external device according to a selection signal, and supplying the selected clock signal to the first and second data holding parts.

13. The semiconductor device according to claim 1, wherein the output buffer comprises high breakdown voltage elements, and the internal circuit and the delay test circuit comprise low breakdown voltage elements having lower breakdown voltage than that of the high breakdown voltage elements, and
wherein the high breakdown voltage elements are formed at an area separate from the low breakdown elements.

14. The semiconductor device according to claim 1, further comprising a second feedback line branched off from a second signal line in the output buffer connected to the output stage circuit in the output buffer.

15. The semiconductor device according to claim 1, wherein the feedback line provides the data signal to the delay test circuit to test the delay in a signal provided to the output buffer by the delay test circuit.

16. The semiconductor device according to claim 15, further comprising a second feedback line branched off from a second signal line in the output buffer and receiving for the delay test circuit, a second data signal for the output stage circuit in the output buffer.

17. The semiconductor device according to claim 16, wherein the second feedback line includes the second data signal different than the data signal.

18. A semiconductor device comprising:
an internal circuit executing a predetermined processing based on an input signal;
an output buffer outputting an output signal to an output terminal according to a signal output from the internal circuit;
a feedback line branched off from a signal line in the output buffer transmitting a data signal to an output stage circuit in the output buffer; and
a test circuit for testing a delay by receiving the data signal from the feedback line, the data signal including a signal according to a test signal transmitted by the test circuit to the output buffer.

19. A semiconductor device comprising:
an internal circuit executing a predetermined processing based on a signal input from an external device;
an output buffer outputting an output signal to an output terminal based on a signal output from the internal circuit;
a plurality of feedback lines branched off from lines in the output buffer transmitting data signals to an output stage circuit in the output buffer; and
a delay test circuit sending a plurality of test signals to the output buffer and respectively receiving a plurality of feedback signals according to the test signals through the plurality of feedback lines.

* * * * *